(12) United States Patent
Luan

(10) Patent No.: US 10,141,471 B2
(45) Date of Patent: Nov. 27, 2018

(54) PROXIMITY DETECTOR DEVICE WITH INTERCONNECT LAYERS AND RELATED METHODS

(71) Applicant: STMICROELECTRONICS (SHENZHEN) R&D CO., LTD., Shenzhen (CN)

(72) Inventor: Jing-En Luan, Singapore (SG)

(73) Assignee: STMICROELECTRONICS (SHENZHEN) R&D CO., LTD., Shenzhen (CN)

( * ) Notice: Subject to any disclaimer, the term of this patent is extended or adjusted under 35 U.S.C. 154(b) by 0 days.

(21) Appl. No.: 15/668,138

(22) Filed: Aug. 3, 2017

(65) Prior Publication Data

US 2017/0330989 A1    Nov. 16, 2017

Related U.S. Application Data

(62) Division of application No. 14/259,344, filed on Apr. 23, 2014, now Pat. No. 9,768,341.

(30) Foreign Application Priority Data

Apr. 28, 2013  (CN) .......................... 2013 1 0158554

(51) Int. Cl.
*H01L 31/173*   (2006.01)
*H01L 31/0203*  (2014.01)
(Continued)

(52) U.S. Cl.
CPC .......... *H01L 31/173* (2013.01); *G01S 7/4813* (2013.01); *G01S 17/026* (2013.01);
(Continued)

(58) Field of Classification Search
CPC ........... H01L 31/0203; H01L 31/02327; H01L 24/19; H01L 25/167; H01L 31/02164;
(Continued)

(56) References Cited

U.S. PATENT DOCUMENTS 4,458,152 A    7/1984   Bonora
5,374,787 A   12/1994   Miller et al.
(Continued)

FOREIGN PATENT DOCUMENTS

CN         203422471         2/2014

OTHER PUBLICATIONS

Guke, "Ultrasonic Proximity Sensor for Blind Guiding," China Academic Journal Electronic Publishing House, Aug. 2009, pp. 1-2.
(Continued)

*Primary Examiner* — Mouloucoulaye Inoussa
(74) *Attorney, Agent, or Firm* — Slater Matsil, LLP

(57) ABSTRACT

A proximity detector device may include a first interconnect layer including a first dielectric layer, and first electrically conductive traces carried thereby, an IC layer above the first interconnect layer and having an image sensor IC, and a light source IC laterally spaced from the image sensor IC. The proximity detector device may include a second interconnect layer above the IC layer and having a second dielectric layer, and second electrically conductive traces carried thereby. The second interconnect layer may have first and second openings therein respectively aligned with the image sensor IC and the light source IC. Each of the image sensor IC and the light source IC may be coupled to the first and second electrically conductive traces. The proximity detector device may include a lens assembly above the second interconnect layer and having first and second lenses respectively aligned with the first and second openings.

20 Claims, 8 Drawing Sheets

(51) Int. Cl.
*H01L 31/0232* (2014.01)
*G01S 7/481* (2006.01)
*G01S 17/02* (2006.01)
*G01S 17/08* (2006.01)
*H01L 23/00* (2006.01)

(52) U.S. Cl.
CPC ............. G01S 17/08 (2013.01); H01L 24/19 (2013.01); H01L 31/0203 (2013.01); H01L 31/02327 (2013.01); *H01L 2224/48091* (2013.01); *H01L 2224/73265* (2013.01); *H01L 2224/8592* (2013.01); *H01L 2924/12041* (2013.01); *H01L 2924/181* (2013.01)

(58) Field of Classification Search
CPC ............. H01L 27/14618; H01L 31/167; H01L 31/173; H01L 31/125; G01S 17/026; G01S 7/4813; H03K 17/941
USPC ............. 257/82, 774, 432; 438/25; 356/614
See application file for complete search history.

(56) References Cited

U.S. PATENT DOCUMENTS

| | | | |
|---|---|---|---|
| 5,495,077 | A | 2/1996 | Miller et al. |
| 5,648,642 | A | 7/1997 | Miller et al. |
| 6,281,882 | B1 | 8/2001 | Gordon et al. |
| 7,339,684 | B2 | 3/2008 | Njolstad |
| 2004/0263668 | A1 | 12/2004 | Kim et al. |
| 2009/0057544 | A1 | 3/2009 | Brodie et al. |
| 2009/0181490 | A1* | 7/2009 | Weng ................ H01L 27/14618 438/69 |
| 2011/0250928 | A1 | 10/2011 | Schlub et al. |
| 2012/0035883 | A1 | 2/2012 | Teissier et al. |
| 2012/0132793 | A1 | 5/2012 | Campbell et al. |
| 2012/0133955 | A1 | 5/2012 | Baxter |
| 2012/0133956 | A1 | 5/2012 | Findlay et al. |
| 2012/0139870 | A1 | 6/2012 | Beyly et al. |
| 2012/0153120 | A1 | 6/2012 | Baxter |
| 2012/0194479 | A1 | 8/2012 | Stark et al. |
| 2012/0248625 | A1 | 10/2012 | Coffy et al. |
| 2013/0033736 | A1 | 2/2013 | McCabe et al. |
| 2013/0248887 | A1 | 9/2013 | Coffy et al. |
| 2013/0267273 | A1* | 10/2013 | Rudmann ............. G01S 17/026 455/556.1 |

OTHER PUBLICATIONS

Myllymaki et al., "Measurement Method for Sensitivity Analysis of Proximity Sensor and Sensor Antenna Integration in a Handheld Device," Progress in Electromagnetics Research C, vol. 20, 2011, pp. 255-268.

Verygman et al., "Detect Further Target with Proximity Sensor," 2012 pp. 1-2.

* cited by examiner

PROXIMITY DETECTOR DEVICE WITH INTERCONNECT LAYERS AND RELATED METHODS

CROSS-REFERENCE TO RELATED APPLICATIONS

This application is a divisional of U.S. patent application Ser. No. 14/259,344, filed on Apr. 23, 2014, and entitled "Proximity Detector Device with Interconnect Layers and Related Methods," which application claims the benefit of Chinese Patent Application No. 201310158554X, filed on Apr. 28, 2013, which applications are hereby incorporated herein by reference.

TECHNICAL FIELD

The present disclosure relates to the field of image sensor devices, and, more particularly, to a proximity detector device and related methods.

BACKGROUND

Typically, electronic devices include one or more image sensor modules for providing enhanced media functionality. For example, the typical electronic device may utilize the image sensor modules for photo capturing and video teleconferencing. Some electronic devices include additional image sensor devices used for other purposes, such as a proximity detector.

For example, the electronic device may use the proximity detector to provide object distances for providing focusing adjustment to the camera purposed image sensor modules. In mobile device applications, the proximity detector may be used to detect when the user's hand is nearby, thereby quickly and accurately waking the device from a power saving sleep mode. Typically, the proximity detector comprises a light source directing radiation to a potential nearby object, and an image sensor receiving the radiation reflected off of the nearby object.

For example, U.S. Patent Application No. 2009/0057544 to Brodie et al, assigned to the present application's assignee, discloses an image sensor module for a mobile device. The image sensor module comprises a lens, a housing carrying the lens, and a lens cap over the lens and housing. The image sensor module includes a barrel mechanism for adjusting the lens. During manufacture of an electronic device including one or more image sensor modules, there is a desire to manufacture the electronic device as quickly as possible, particularly in mass production runs.

The typical image sensor module is manufactured in a multi-step process. The first steps include semiconductor processing to provide the image sensor integrated circuit (IC). The next steps include some form of testing for the image sensor IC and packaging. The image sensor IC may be assembled into the image sensor module, along with a lens and movable barrel if needed. This assembly of the image sensor module may be performed manually or via machine. For example, in electronic devices that use surface mounted components, a pick-and-place (P&P) machine may assemble the components onto a printed circuit board (PCB). A drawback to such singular packaging is that it may be relatively inefficient and also may require that each device be tested individually, adding to the manufacturing time.

An approach to an image sensor is disclosed in U.S. Patent Application Publication No. 2012/0248625 to Coffy et al., assigned to the present application's assignee. This image sensor comprises a transparent support, a pair of ICs on the transparent support, and encapsulation material on the transparent support and surrounding the pair of ICs.

Referring now to FIG. 1, a proximity detector 20, as in the prior art, includes a dielectric layer 26, an image sensor IC 24 on the dielectric layer, a light source device 22 also on the dielectric layer, and an adhesive material 25 between the image sensor IC and the dielectric layer. The proximity detector 20 includes a cap 21 positioned on the dielectric layer 26 and having a plurality of openings 31, 32a-32b therein, and transparent adhesive material 23 covering the light source device 22. The proximity detector 20 also includes a lens 27 carried by the cap 21, and a plurality of wire bonds 29a-29c coupling the image sensor IC 24 and the light source device 22 to electrically conductive traces on the dielectric layer 26. The proximity detector 20 also includes additional transparent adhesive material 28 between the image sensor IC 24 and the lens 27. A potential drawback to this proximity detector 20 includes a multi-step high precision assembly process using a P&P device. Also, the proximity detector 20 may be less reliable and difficult to integrate into mobile devices, due to size constraints.

SUMMARY

In view of the foregoing background, it is therefore an object of the present disclosure to provide a proximity detector device that is efficient to manufacture.

This and other objects, features, and advantages in accordance with the present disclosure are provided by a proximity detector device comprising a first interconnect layer comprising a first dielectric layer, and a plurality of first electrically conductive traces carried thereby, an IC layer above the first interconnect layer and comprising an image sensor IC, and a light source IC laterally spaced from the image sensor IC. The proximity detector may comprise a second interconnect layer above the IC layer and comprising a second dielectric layer, and a plurality of second electrically conductive traces carried thereby. The second interconnect layer may have first and second openings therein respectively aligned with the image sensor IC and the light source IC. Each of the image sensor IC and the light source IC may be coupled to the pluralities of first and second electrically conductive traces. The proximity detector may comprise a lens assembly above the second interconnect layer and comprising first and second lenses respectively aligned with the first and second openings. Advantageously, the proximity detector may be manufactured using robust wafer level processing techniques and have a reduced size.

In particular, the IC layer may comprise encapsulation material laterally surrounding the image sensor IC and the light source IC. The encapsulation material may comprise a plurality electrically conductive vias, each coupled between a respective aligned pair of the pluralities of first and second electrically conductive traces.

The proximity detector device may further comprise transparent adhesive material in the first and second openings of the second interconnect layer. In some embodiments, the lens assembly may further comprise a molding compound surrounding the first and second lenses, and having first and second openings aligned with respective ones of the first and second lenses.

Additionally, the proximity detector device may further comprise a plurality of contacts coupled respectively to the plurality of first electrically conductive traces. For example, the plurality of contacts may comprise a plurality of ball grid array (BGA) contacts. The first lens may comprise a filter lens. The light source IC may comprise a light emitting diode.

Another aspect is directed to a method of making a proximity detector device. The method may comprise forming a first interconnect layer comprising a first dielectric layer, and a plurality of first electrically conductive traces carried thereby, forming an IC layer above the first interconnect layer and comprising an image sensor IC, and a light source IC laterally spaced from the image sensor IC. The method may include forming a second interconnect layer above the IC layer and comprising a second dielectric layer, and a plurality of second electrically conductive traces carried thereby. The second interconnect layer may have first and second openings therein respectively aligned with the image sensor IC and the light source IC. Each of the image sensor IC and the light source IC may be coupled to the pluralities of first and second electrically conductive traces. The method may also include forming a lens assembly above the second interconnect layer and comprising first and second lenses respectively aligned with the first and second openings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The present embodiments will now be described more fully hereinafter with reference to the accompanying drawings, in which preferred embodiments of the present disclosure are shown. This present embodiments may, however, be embodied in many different forms and should not be construed as limited to the embodiments set forth herein. Rather, these embodiments are provided so that this disclosure will be thorough and complete, and will fully convey the scope of the present embodiments to those skilled in the art. Like numbers refer to like elements throughout, and prime notation is used to indicate similar elements in alternative embodiments.

Figure 1:
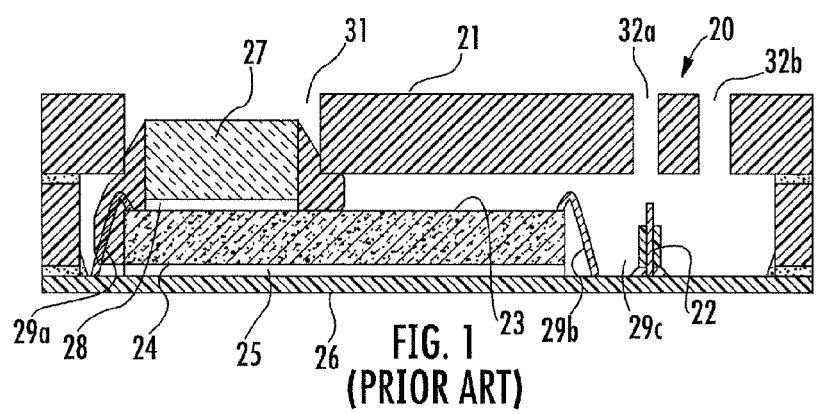
FIG. 1 is a schematic cross-sectional view of a proximity detector device, according to the prior art.
Figure 2:
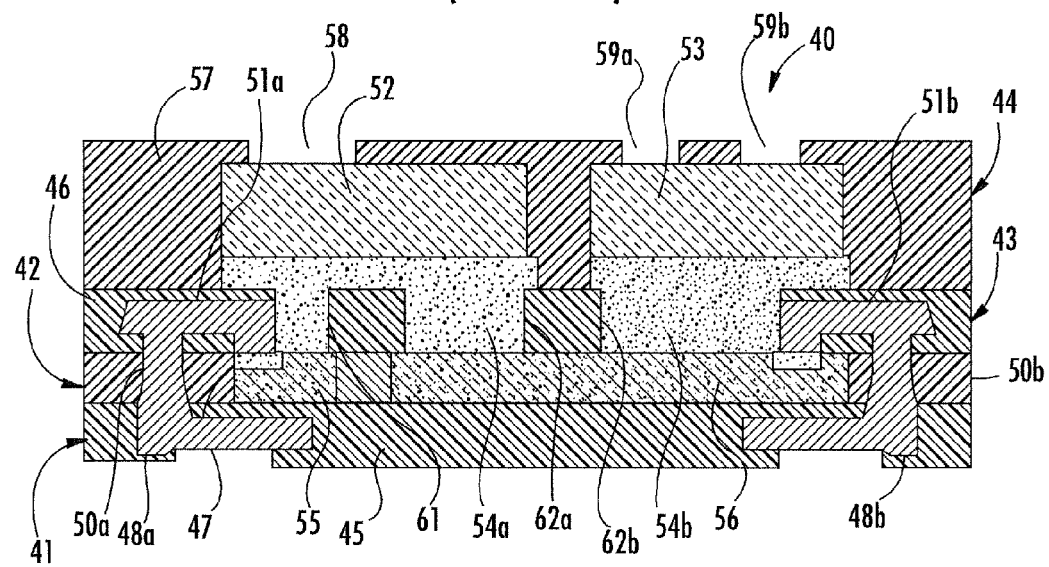
FIG. 2 is a schematic cross-sectional view of a proximity detector device, according to the present disclosure.
Figure 3:
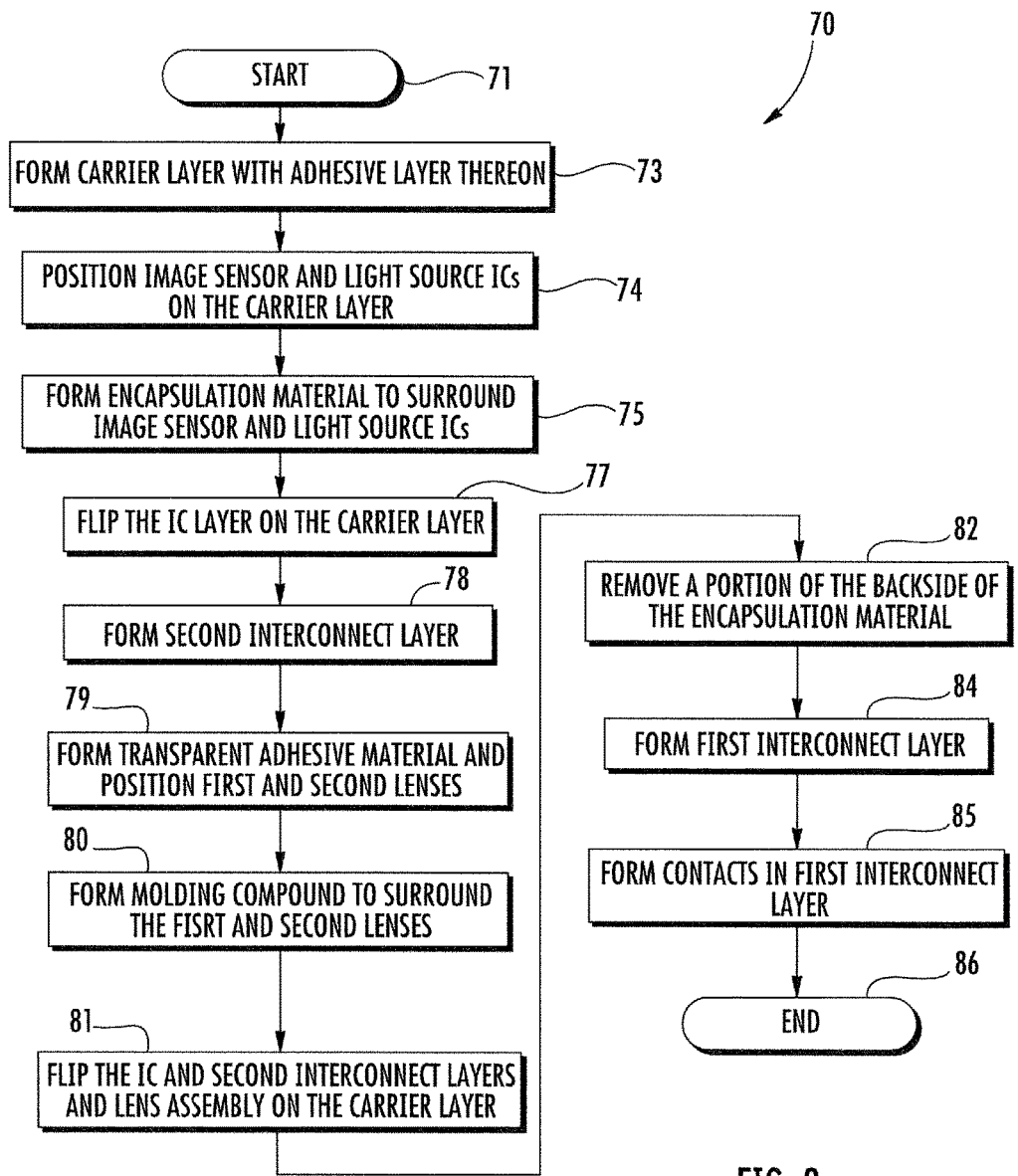
FIG. 3 is a flowchart of a method for making the proximity detector device of FIG. 2.

Referring initially to FIG. 2, a proximity detector device 40 according to the present disclosure is now described. The proximity detector device 40 illustratively includes a first interconnect layer 41 comprising a first dielectric layer 45, and a plurality of first electrically conductive traces 48a-48b carried thereby. The proximity detector device 40 illustratively includes an IC layer 42 above the first interconnect layer 41 and comprising an image sensor IC 56, and a light source IC 55 laterally spaced from the image sensor IC. The light source IC 55 may comprise a light emitting diode (LED), such as an infrared LED.

The proximity detector device 40 illustratively includes a second interconnect layer 43 above the IC layer 42 and comprising a second dielectric layer 46, and a plurality of second electrically conductive traces 51a-51b carried thereby. The second interconnect layer 43 illustratively includes first openings 62a-62b and a second opening 61 therein respectively aligned with the image sensor IC 56 and the light source IC 55. Each of the image sensor IC 56 and the light source IC 55 is coupled to the pluralities of first 48a-48b and second 51a-51b electrically conductive traces.

In the illustrated embodiment, the first openings 62a-62b are illustratively aligned with the image sensor IC 56. The pair of first openings 62a-62b provides the imaging sensor IC 56 with access to the first and second lenses cavities.

The proximity detector device 40 illustratively includes a lens assembly 44 above the second interconnect layer 43. The lens assembly 44 illustratively includes first 53 and second 52 lenses respectively aligned with the first openings 62a-62b and the second opening 61.

In particular, the IC layer 42 includes encapsulation material 47 laterally surrounding the image sensor IC 56 and the light source IC 55. The encapsulation material 47 illustratively includes a plurality electrically conductive vias 50a-50b passing therethrough. Each electrically conductive via 50a-50b is coupled between a respective aligned pair of the pluralities of first 48a-48b and second 51a-51b electrically conductive traces.

The proximity detector device 40 illustratively includes transparent adhesive material 54a-54b in the first openings 62a-62b and the second opening 61 of the second interconnect layer. In the illustrated embodiment, the lens assembly 44 includes a molding compound 57 surrounding the first 53 and second 52 lenses. The lens assembly 44 illustratively includes first openings 59a-59b and a second opening 58 aligned with respective ones of the first 53 and second 52 lenses. In the illustrated embodiment, the first openings 59a-59b are aligned with the first lens 53.

Additionally, the proximity detector device illustratively includes a plurality of contacts 49a-49b (FIG. 16) coupled respectively to the plurality of first electrically conductive traces 48a-48b. For example, the plurality of contacts 49a-49b (FIG. 16) may comprise a plurality of BGA contacts. The first lens 53 may comprise a filter lens (e.g. glass filter or transparent sheet with filter coating). The first lens 53 may also comprise a focusing element in addition or alternatively.

Another aspect is directed to a method of making a proximity detector device 40. The method may comprise forming a first interconnect layer 41 comprising a first dielectric layer 45, and a plurality of first electrically conductive traces 48a-48b carried thereby. The method may include forming an IC layer 42 above the first interconnect layer 41 and comprising an image sensor IC 56, and a light source IC 55 laterally spaced from the image sensor IC. The method may include forming a second interconnect layer 43 above the IC layer 42 and comprising a second dielectric layer 46, and a plurality of second electrically conductive traces 51-51b carried thereby. The second interconnect layer may have first openings 62a-62b and a second 61 opening therein respectively aligned with the image sensor IC 56 and the light source IC 55, each of the image sensor IC and the light source IC being coupled to the pluralities of first 48a-48b and second 51-51b electrically conductive traces. The method may also include forming a lens assembly 44 above the second interconnect layer 43 and comprising first 53 and second 52 lenses respectively aligned with the first openings 62a-62b and the second opening 61.

Figure 4:
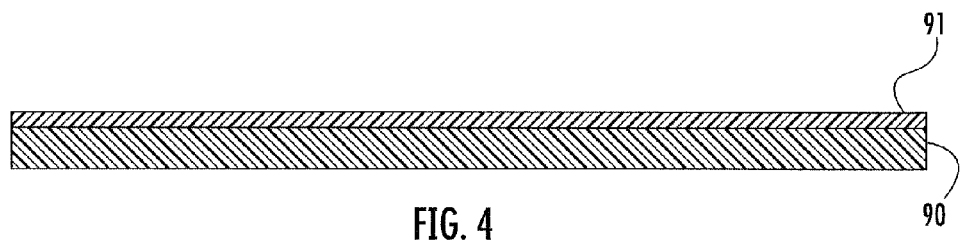
FIGS. 4-13 are schematic cross-sectional views of steps for making the proximity detector device of FIG. 2.
Figure 5:
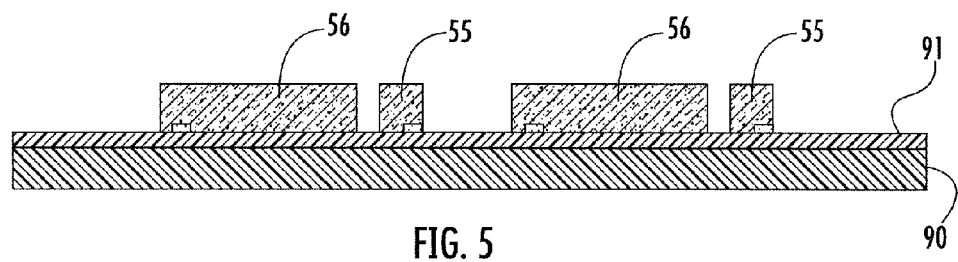
Figure 6:
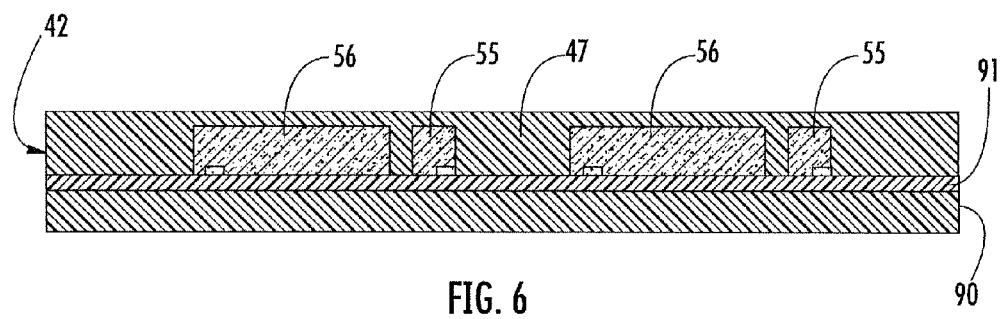

Referring now additionally to FIGS. 3-16, a flowchart 70 illustrates a method for making the semiconductor device 20 (Block 71). In the illustrated embodiments, a wafer level processing technique for making a pair of identical proximity detector devices 40 is shown, but it should be appreciated that typical processes would include the manufacture of a large number of proximity detector devices (sometimes including varying embodiments in a single manufacturing process, i.e. the illustrated adjacent proximity detectors need not be identical). The method includes forming a carrier layer 90, and an adhesive layer 91 on the carrier layer (FIG. 4 and Block 73). The method includes positioning image sensor ICs 56 and light source ICs 55 on the adhesive layer 91 (FIG. 5 and Block 74). At this point, any other desired surface mount devices (e.g. capacitors) may also be positioned. The method includes forming an encapsulation material 47 on the image sensor ICs 56 and light source ICs 55 to define an IC layer 42 (FIG. 6 and Block 75).

Figure 7:
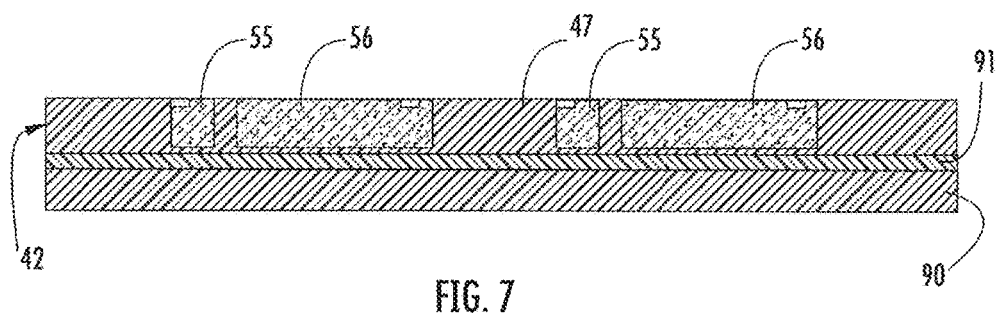
Figure 8:
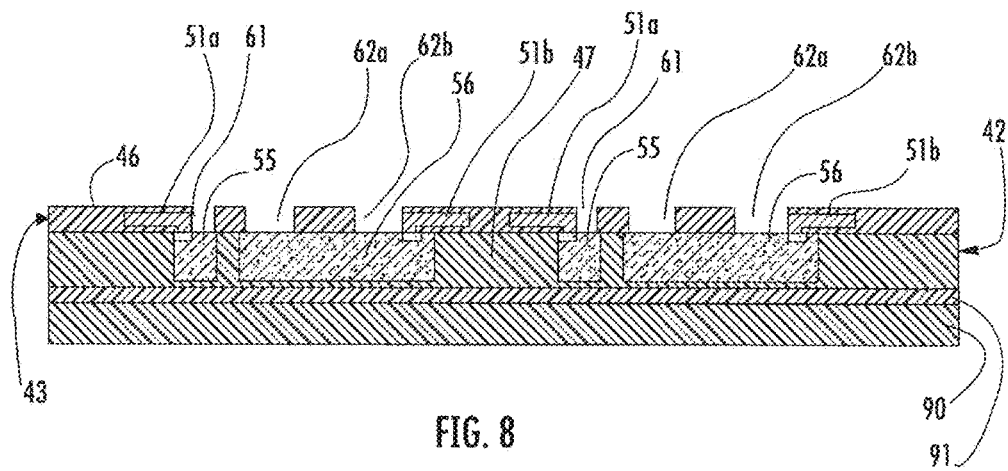

The method includes flipping the IC layer 42 on the carrier layer 90 by heating the adhesive layer 91 to detach the IC layer and reapplying the IC layer to the adhesive layer on an opposite face thereof (FIG. 7 and Block 77). The method also includes forming a second interconnect layer 43 and a plurality of second electrically conductive traces 51a-51b carried thereby (FIG. 8 and Block 78).

Figure 9:
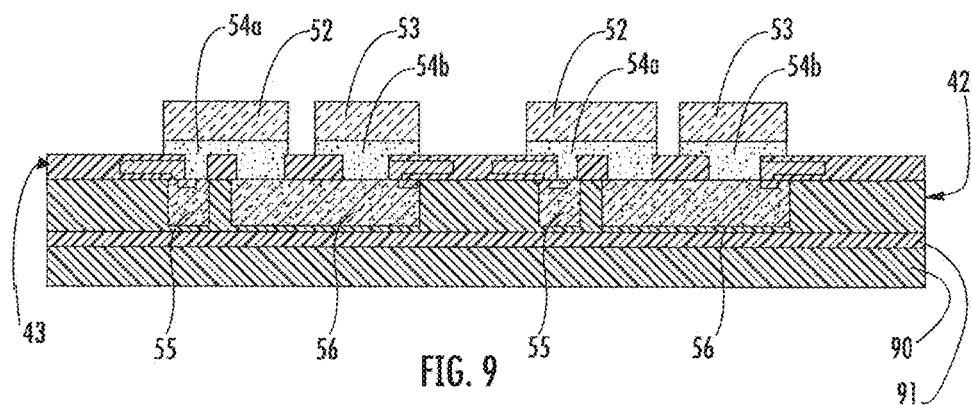

The method includes forming a transparent adhesive material 54a-54b in first openings 62a-62b and the second opening 61 of the second interconnect layer 43. The method also includes positioning first 53 and second 52 lenses on the transparent adhesive material 54a-54b (FIG. 9 and Block 79).

Figure 10:
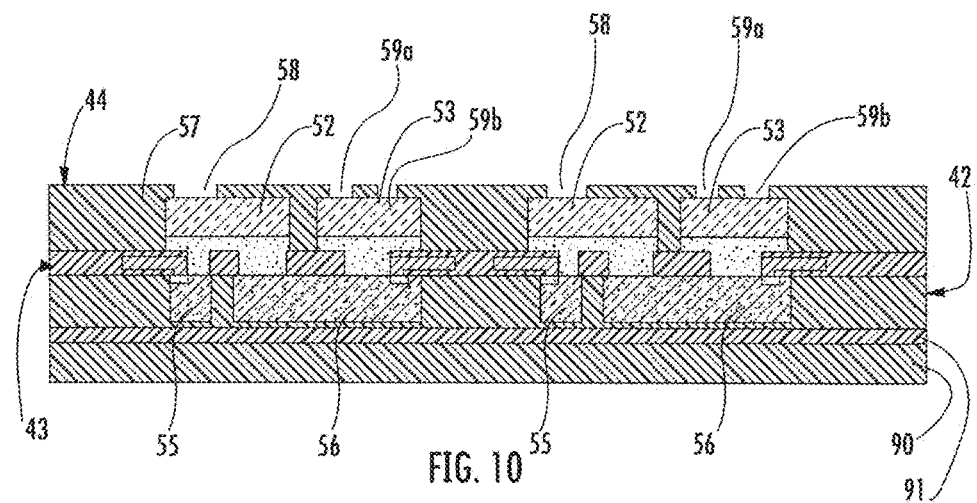
Figure 11:
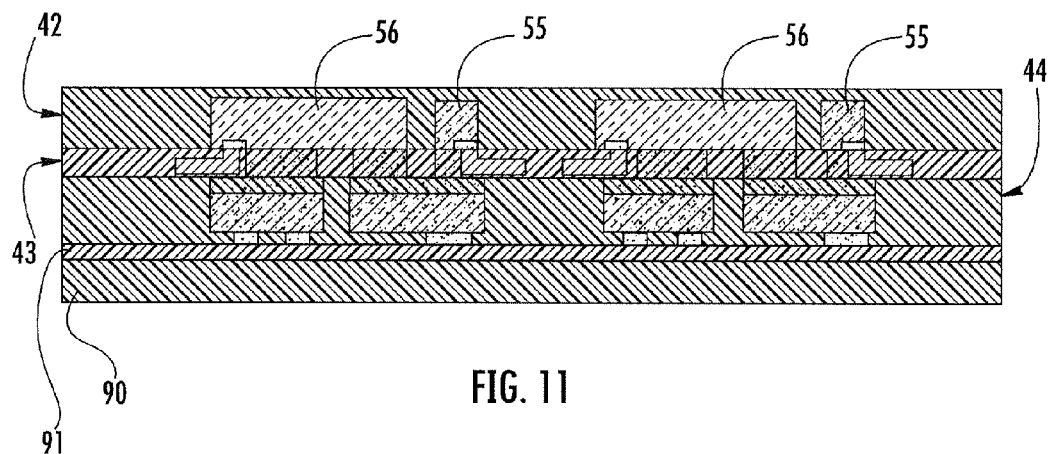
Figure 12:
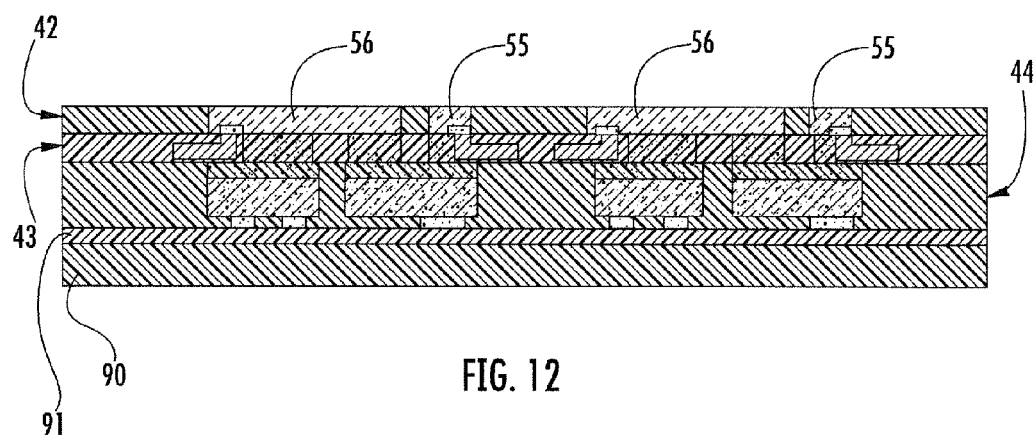

The method includes forming molding compound 57 on the first 53 and second 52 lenses to define a lens assembly 44 (FIG. 10 and Block 80). In some embodiments, the forming of the molding compound 57 may be film assisted. The method includes flipping the IC 42 and second interconnect layers 43, and lens assembly 44 on the carrier layer 90 (FIG. 11 and Block 81) (again using a heating step to deactivate the adhesive layer 91). The method includes grinding a portion of the backside of the IC layer 42 (FIG. 12 and Block 82).

Figure 13:
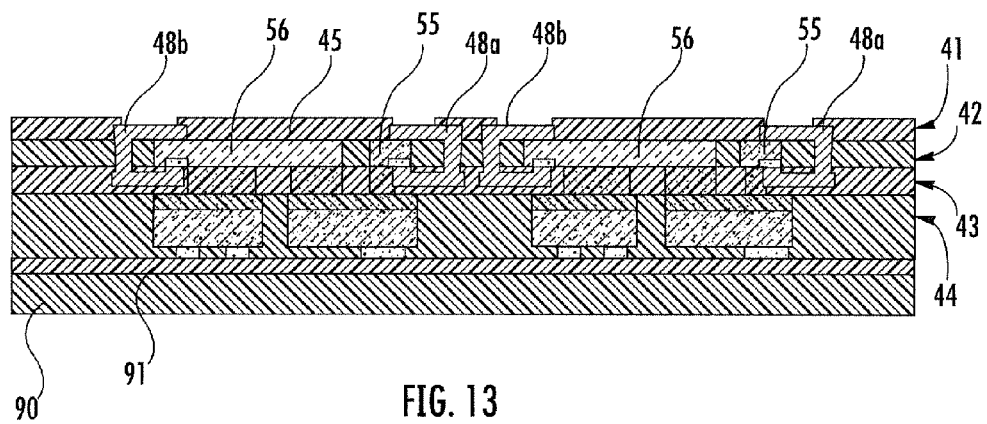

The method includes forming a first interconnect layer 41 comprising a first dielectric layer 45, and a plurality of first electrically conductive traces 48a-48b carried thereby (FIG. 13 and Block 84). In this embodiment, the plurality of first electrically conductive traces 48a-48b defines LGA contacts. The method also includes a singulation step (FIG. 15) (Blocks 84-86).

Advantageously, the proximity detector device 40 may be manufactured using robust wafer level processing techniques. Additionally, the proximity detector device 40 may be made in large quantities. Moreover, the structure is mechanically robust since the first 53 and second 52 lenses are tightly integrated with the lens assembly molding compound 57. Also, the lens assembly 44 is tightly integrated with the first 41, second 43 interconnect layers and the IC layer 43, also adding mechanical rigidity. The packaging of the proximity detector device 40 is thinner than typical approaches, thereby permitting easier integration into mobile devices. Moreover, the proximity detector device 40 provides for good co-planarity for the image sensor and light source ICs 55-56, thereby reducing the computational load of proximity detection calculations (i.e. from having adjacent source and receiver positions).

Figure 14:
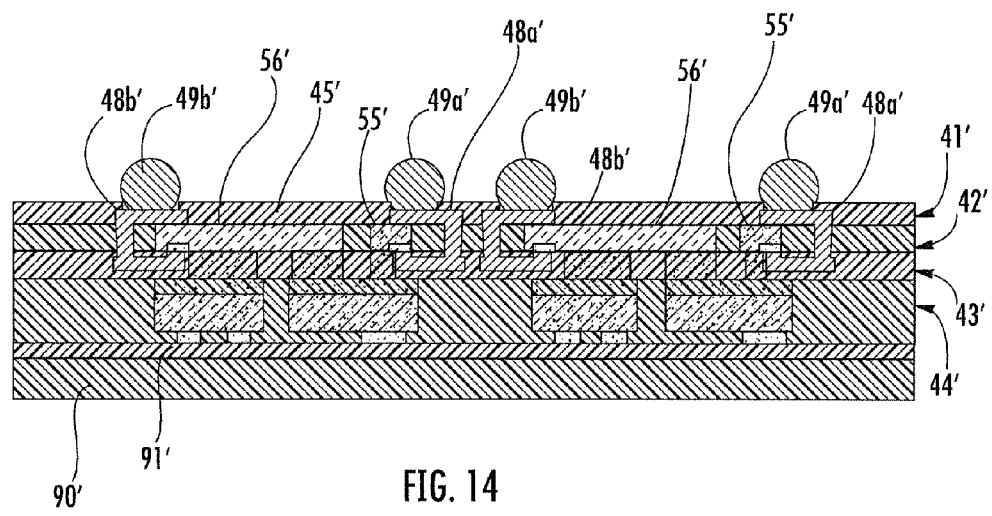
FIGS. 14-16 are schematic cross-sectional views of steps for making another embodiment of the proximity detector, according to the present disclosure.
Figure 15:
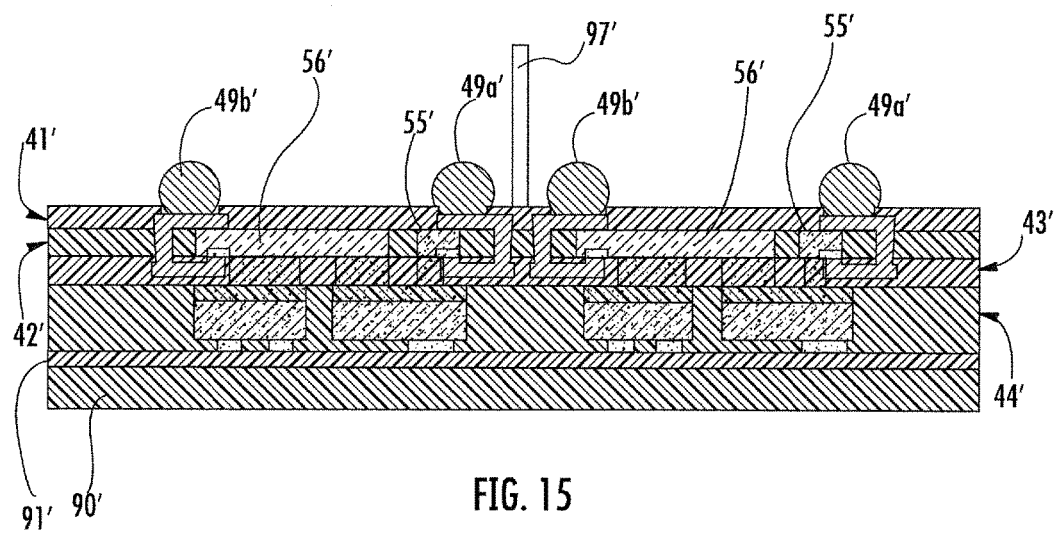
Figure 16:
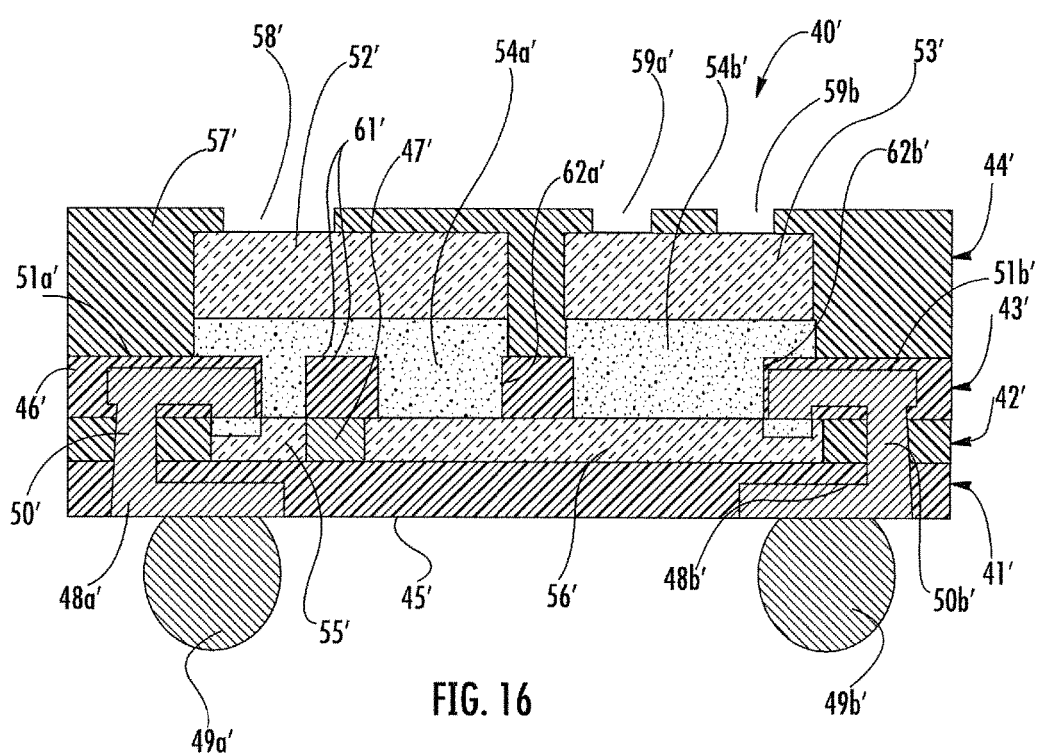

Referring now additionally to FIGS. 14-16, steps from another embodiment of the method for making the proximity detector device 40' is now described. In this embodiment of the method for making the proximity detector device 40', those steps and elements already discussed above with respect to FIGS. 2-13 are given prime notation and most require no further discussion herein. This embodiment differs from the previous embodiment in that this method illustratively includes forming a plurality of ball grid array contacts 49a'-49b' on the plurality of first electrically conductive traces 48a'-48b' (FIG. 14 and Block 85). The method illustratively includes a singulation step using a dicing blade 97' (FIGS. 15-16).

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A device, comprising:
 a first interconnect layer comprising a first dielectric layer and a plurality of first electrically conductive traces;
 an integrated circuit (IC) layer overlying the first interconnect layer and comprising an image sensor IC and a light source IC laterally spaced from the image sensor IC;
 a second interconnect layer overlying the IC layer and comprising a second dielectric layer and a plurality of second electrically conductive traces, the second interconnect layer having first and second openings respectively aligned with the image sensor IC and the light source IC, the image sensor IC and the light source IC being electrically coupled to the plurality of first electrically conductive traces and the plurality of second electrically conductive traces;
 a transparent adhesive material filling the first and second openings and contacting surfaces of the image sensor IC and the light source IC;
 a lens assembly overlying the second interconnect layer and comprising first and second lenses respectively aligned with the first and second openings, the first and second lenses being adhered to the transparent adhesive material; and
 a plurality of contacts coupled respectively to the plurality of first electrically conductive traces.

2. The device of claim 1, wherein the plurality of contacts comprises a plurality of ball grid array (BGA) contacts.

3. The device of claim 1, wherein a surface of the first dielectric layer directed away from the IC layer is coplanar to a surface of the plurality of first electrically conductive traces.

4. The device of claim 1, wherein the IC layer further comprises encapsulation material laterally surrounding the image sensor IC and the light source IC.

5. The device of claim 4, wherein the IC layer further comprises a plurality of electrically conductive vias extending through the encapsulation material, each of the plurality of electrically conductive vias being coupled between a respective aligned pair of the pluralities of first and second electrically conductive traces.

6. The device of claim 1, wherein the first and second openings have sidewalls defined by at least the second dielectric layer.

7. The device of claim 1, wherein the lens assembly further comprises a molding compound surrounding the first and second lenses, and having third and fourth openings aligned with respective ones of the first and second lenses.

8. The device of claim 1, wherein the transparent adhesive material completely fills the first and second openings.

9. The device of claim 8, wherein at least a portion of the transparent adhesive material extends into a portion of the lens assembly.

10. A device, comprising:
 a first interconnect layer comprising a plurality of first electrically conductive traces;
 a plurality of ball grid array (BGA) contacts coupled to a first surface of the plurality of first electrically conductive traces;
 an integrated circuit (IC) layer over a second surface of the plurality of first electrically conductive traces and comprising:
  an image sensor IC;
  a light source IC laterally spaced from the image sensor IC; and
  an encapsulant laterally surrounding the image sensor IC and the light source IC;
 a second interconnect layer over the IC layer and comprising a plurality of second electrically conductive traces, the second interconnect layer having first and second openings defined by a dielectric material of the second interconnect layer, the first and second openings being respectively aligned with the image sensor IC and the light source IC;
 a lens assembly above the second interconnect layer and comprising first and second lenses respectively aligned with the first and second openings; and
 a transparent adhesive material completely filling the first and second openings of the second interconnect layer, the transparent adhesive material having surfaces adhered to and physically contacting each of the first and second lenses, the image sensor IC, and the light source IC.

11. The device of claim 10, wherein the first lens comprises a filter lens.

12. The device of claim 10, wherein the light source IC comprises a light emitting diode.

13. The device of claim 10, further comprising a plurality of electrically conductive vias, each coupled between a respective aligned pair of the plurality of first electrically conductive traces and the plurality of second electrically conductive traces.

14. The device of claim 10, wherein the lens assembly further comprises a molding compound laterally surrounding the first and second lenses, the molding compound having first and second openings aligned with respective ones of the first and second lenses.

15. A device, comprising:
 a first interconnect layer comprising a first dielectric layer and a plurality of first electrically conductive traces, wherein an externally-facing surface of the first dielectric layer is coplanar to an externally-facing surface of the plurality of first electrically conductive traces;
 an integrated circuit (IC) layer overlying the first interconnect layer and comprising an image sensor IC and a light source IC laterally spaced from the image sensor IC;
 a second interconnect layer overlying the IC layer and comprising a second dielectric layer and a plurality of second electrically conductive traces, the second interconnect layer having a first opening and a second opening respectively aligned with the image sensor IC and the light source IC, the image sensor IC and the light source IC being electrically coupled to the plurality of first electrically conductive traces and the plurality of second electrically conductive traces; and
 a lens assembly overlying the second interconnect layer and comprising a first lens and a second lens respectively aligned with the first opening and the second opening;
 a transparent adhesive material disposed within the first opening and the second opening and physically contacting surfaces of the image sensor IC and the light source IC directed away from the first interconnect layer, the transparent adhesive material extending out of the second interconnect layer into a portion of the lens assembly, the first and second lenses being adhered to the transparent adhesive material; and
 a plurality of contacts coupled respectively to the plurality of first electrically conductive traces.

16. The device of claim 15, wherein the IC layer further comprises a first encapsulation material laterally surrounding the image sensor IC and the light source IC.

17. The device of claim 15, wherein the image sensor IC and the light source IC are electrically coupled to the plurality of second electrically conductive traces at surfaces of the image sensor IC and the light source IC directed away from the first interconnect layer.

18. The device of claim 17, wherein the plurality of second electrically conductive traces is electrically coupled to the plurality of first electrically conductive traces by electrically conductive vias extending through the IC layer.

19. The device of claim 15, wherein the first lens comprises a filter lens.

20. The device of claim 15, wherein the lens assembly comprises a second encapsulation material laterally surrounding the first lens and the second lens, the second encapsulation material further overlying portions of externally-facing surfaces of the first lens and the second lens, the second encapsulation material comprising a third opening and a fourth opening respectively aligned with the first lens and the second lens.

\* \* \* \* \*